United States Patent [19]

Miura

[11] 4,438,427
[45] Mar. 20, 1984

[54] DECODER AND METHOD UTILIZING PARTIAL AND REDUNDANT DECODING

[75] Inventor: Kenichi Miura, Saratoga, Calif.

[73] Assignee: Fujitsu Limited, Kawasaki, Japan

[21] Appl. No.: 926,950

[22] Filed: Jul. 20, 1978

[51] Int. Cl.$^3$ .............................................. H03K 13/24
[52] U.S. Cl. .............................. 340/347 DD; 307/465
[58] Field of Search ................ 340/347 DD; 364/715, 364/900; 307/207

[56] References Cited

U.S. PATENT DOCUMENTS 3,593,317  7/1971  Fleisher .............................. 364/715
3,691,554  9/1972  Marschall .................... 340/347 DD
4,090,190  5/1978  Rostkovsky ................. 340/347 DD

OTHER PUBLICATIONS

Fleisher, "IBM Technical Disclosure Bulletin", vol. 15, No. 8, Jan. 1973, pp. 2510-2511.

*Primary Examiner*—C. D. Miller
*Attorney, Agent, or Firm*—Flehr, Hohbach, Test, Albritton & Herbert

[57] ABSTRACT

Decoder and method utilizing logic circuitry for decoding multi-bit digital signals. An input decoder decodes subsets of the input signals to provide a plurality of intermediate signals which are selectively combined to provide output signals which represent a desired decoding of the input signals. The intermediate signals are applied to generally parallel bus lines which extend centrally of the substrate on which the decoder is constructed. The logic circuits are arranged in blocks along both sides of the bus lines, with all of the bus lines extending past all of the logic blocks, and conductors extending transversely of the bus lines carry the appropriate intermediate signals from the bus lines to the logic blocks.

12 Claims, 13 Drawing Figures

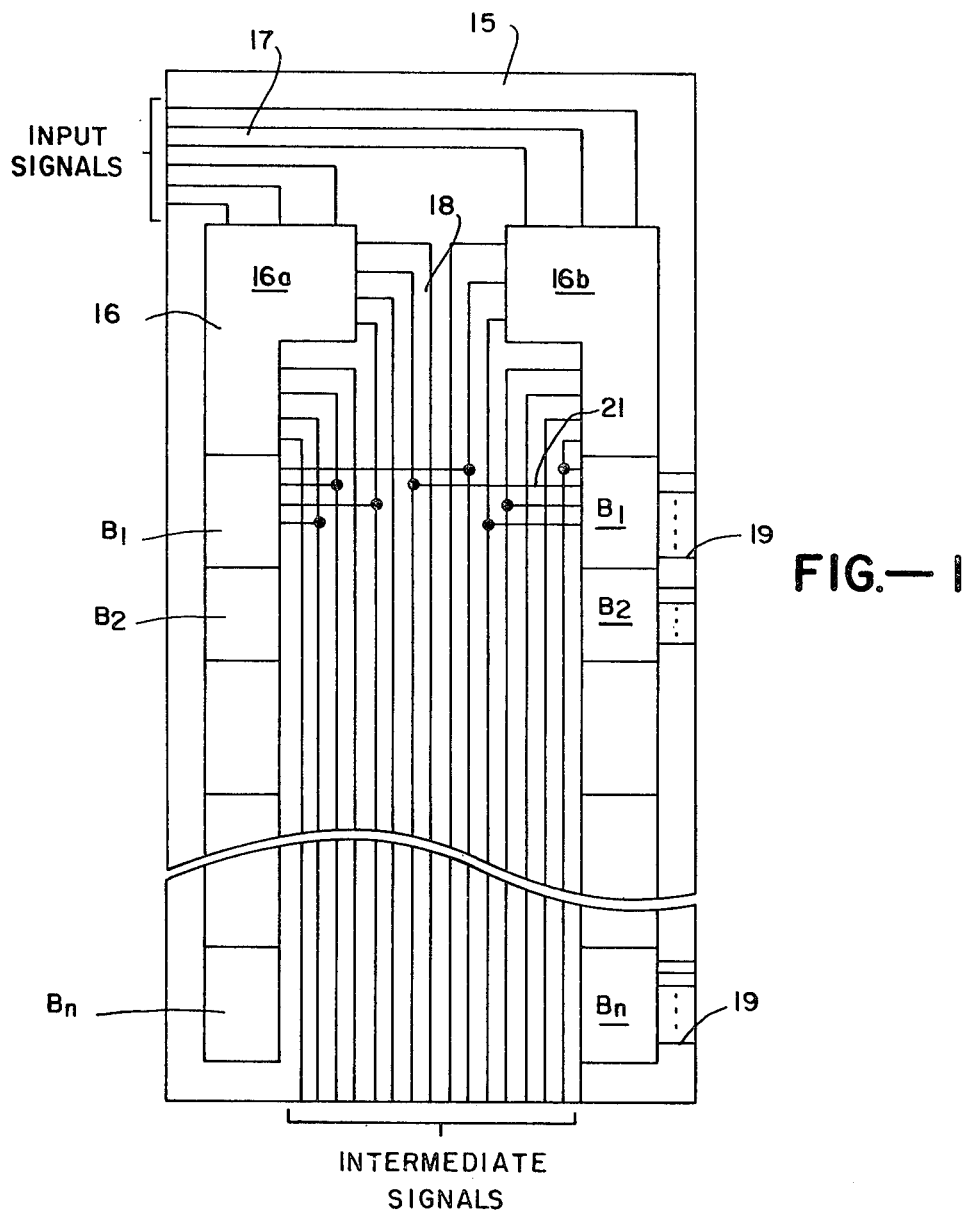
FIG.—1
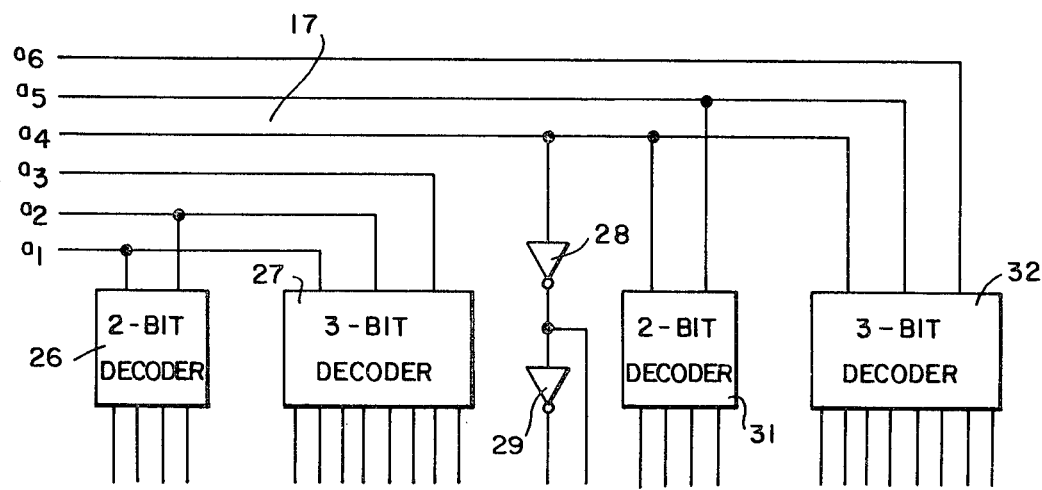
FIG.—3

FIG.—2A
5-BIT INPUT ($a_1, a_2, a_3, a_4, a_5$)
| SUBSETS | LINES PER SUBSET | TOTAL LINES |
|---|---|---|
| ($a_1\ a_2\ a_3$) | 8 | |
| ($a_1\ a_2$) | 4 | |
| ($a_1$) | 2 | 20 |
| ($a_4\ a_5$) | 4 | |
| ($a_4$) | 2 | |
FIG.—2B
6-BIT INPUT ($a_1, a_2, a_3, a_4, a_5, a_6$)
| SUBSETS | LINES PER SUBSET | TOTAL LINES |
|---|---|---|
| ($a_1\ a_2\ a_3$) | 8 | |
| ($a_1\ a_2$) | 4 | |
| ($a_4\ a_5\ a_6$) | 8 | 26 |
| ($a_4\ a_5$) | 4 | |
| ($a_4$) | 2 | |
FIG.—2C
8-BIT INPUT ($a_1, a_2, a_3, a_4, a_5, a_6, a_7, a_8$)
| SUBSETS | LINES PER SUBSET | TOTAL LINES |
|---|---|---|
| ($a_1\ a_2\ a_3$) | 8 | |
| ($a_1\ a_2$) | 4 | |
| ($a_1$) | 2 | |
| ($a_4\ a_5\ a_6$) | 8 | 34 |
| ($a_4\ a_5$) | 4 | |
| ($a_5$) | 2 | |
| ($a_7\ a_8$) | 4 | |
| ($a_7$) | 2 | |
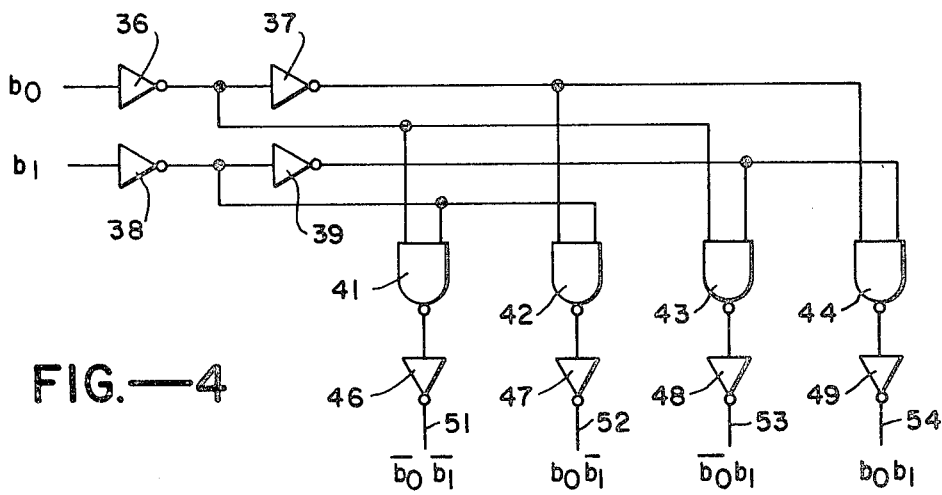
FIG.—4

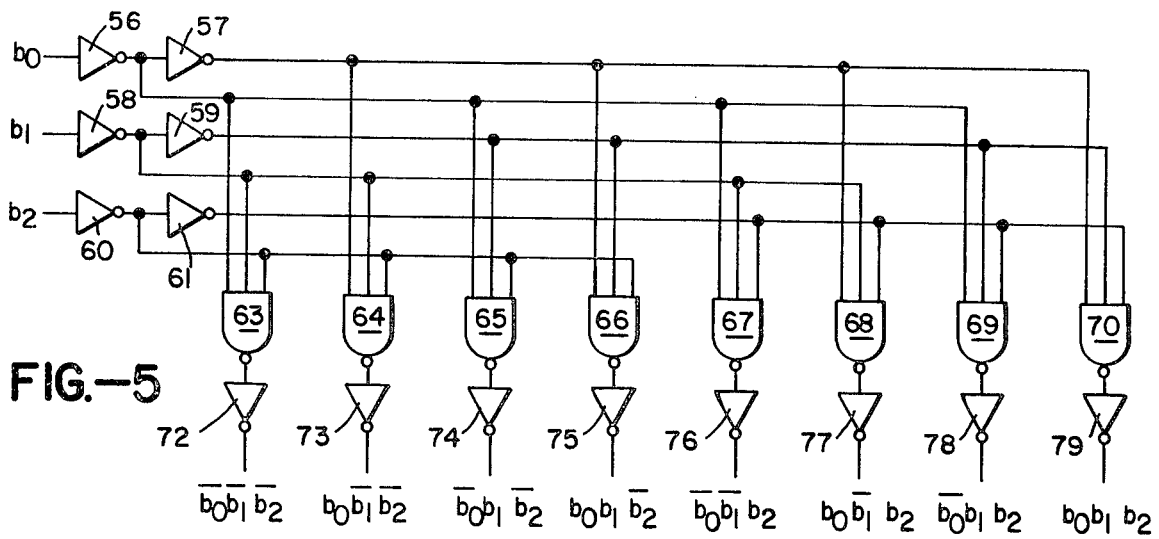
FIG.—5
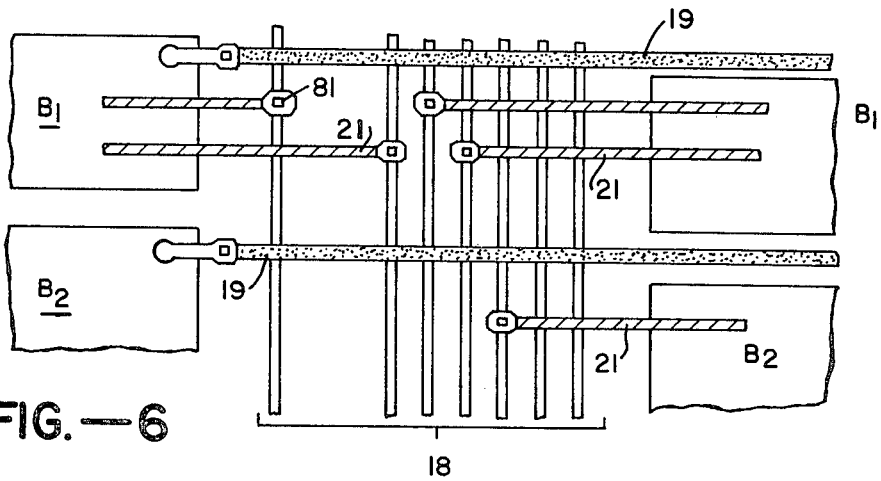
FIG.—6
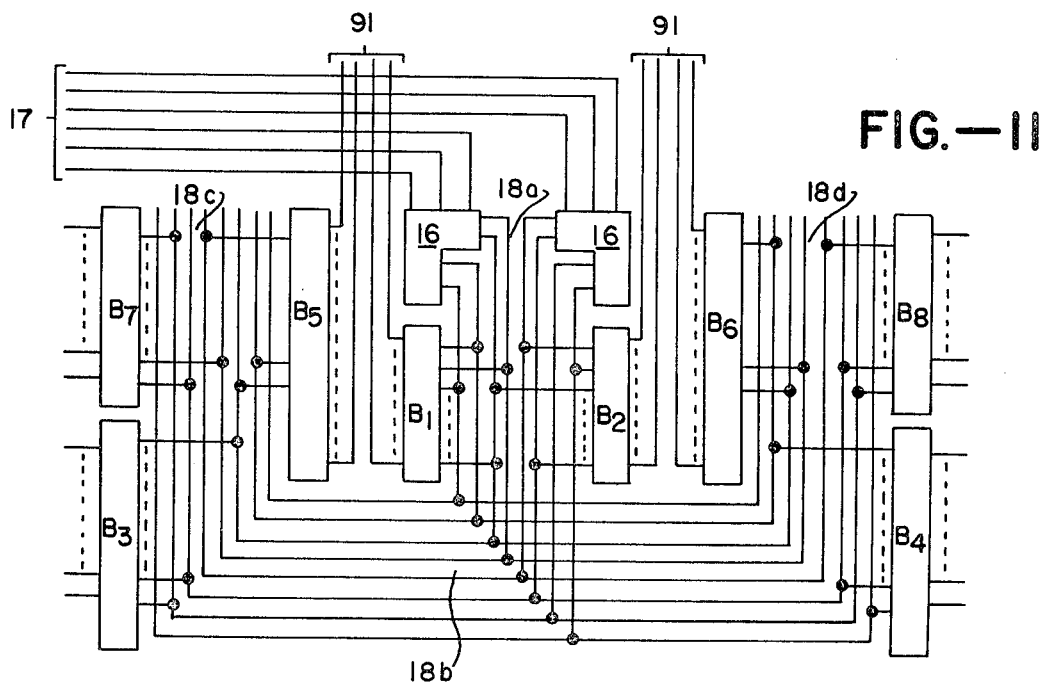
FIG.—11

INSTRUCTION SET

| MNEMONIC CODE | OPERATION CODE |
|---|---|
| BBER | 0 0 |
| BBX  | 1 0 1 1 1 1 |
| B    | 1 0 0 0 1 |
| BIH  | 1 1 0 0 0 0 |
| BIF  | 1 1 0 0 0 1 |
| BCRY | 1 0 0 1 0 |
| CALL | 1 0 0 0 0 |
| RETN | 1 1 0 1 1 1 |
| LXM  | 1 0 0 1 1 |
| STM  | 1 0 1 0 0 |
| MVR  | 1 0 1 0 1 |
| MDRX | 1 0 1 1 0 0 |
| MDRY | 1 0 1 1 0 1 |
| STR  | 1 0 1 1 1 0 |
| SBU  | 0 1 0 0 |
| SBL  | 0 1 0 1 |
| LXI  | 1 1 0 0 1 1 |
| SKU  | 0 1 1 0 |
| SKL  | 0 1 1 1 |
| SKF  | 1 1 0 0 1 0 |
| TRZ  | 1 1 0 1 0 0 |
| TRZI | 1 1 0 1 0 1 |
| TRP  | 1 1 0 1 1 0 |
| SMSK | 1 1 1 0 0 0 |
| RMSK | 1 1 1 0 0 1 |
| SDM  | 1 1 1 0 1 |
|      | 1 1 1 1 0 |
|      | 1 1 1 1 1 |

FIG.—7

BOOLEAN EXPRESSION OF CONTROL SIGNALS

| CONTROL SIGNAL | BOOLEAN EQUATION |
|---|---|
| SMSK | SMSK |
| *RMSK | $\overline{\text{RMSK}}$ |
| *STK | $\overline{\text{CALL}}$ |
| RETN | RETURN |
| SKFC | SKU + SKL + SKF + TRZ̄ + TRZ̄I + TRP |
| BCRY | BCRY |
| *BRU | CALL + B + BIF + RETURN |
| BIH | BIH |
| BTEST | BBER + BBX |
| *CSAC1 | $\overline{\text{BBER + BBX + BIH}}$ |
| *CSAC2 | $\overline{\text{BIHU + BIF + RETN}}$ |
| *CSAC3 | $\overline{\text{CALL + B + BCRY + BIHL + RETN}}$ |
| MS | STM |
| MVR | MVR |
| INDAI | MDRX + MDRY + STR |
| REG | SBU + SBL + MVR + MDRX + MDRY + STR + TRZ̄ + TRZ̄I + TRP |
| REGR | BBER + SBU + SBL + SKU + SKL + LXM + STM + MDRX + MDRY + BIH + BIF + SKF + TRZ̄ + TRZ̄I + TRP + MVREX |
| XICT3 | SBU + SKU + LXM |
| XICT2 | SBL + SKL + LXM |
| XICT1 | BBER + MVR + MDRX + TRZ̄ + TRZ̄I + TRP |
| XREGD | BBER + SBU + SBL + SKU + SKL + MVR + MDRX + TRZ̄ + TRZ̄I + TRP + LXI |
| XREGG | LXM |
| YREG | SBU + SBL + SKU + SKL + MDRY + SKF |
| TRZ̄I | TRZ̄I |
| TRZ̄ | TRZ̄ + TRP + STM + MVR |
| MMS | MDRX + MDRY + STR |
| ALCT5 | SBU + SKU + MDRX + MDRY + STR + SKF |
| ALCT6 | SBL + SKL + MDRX + MDRY + STR + SKF + TRZ̄ + TRZ̄I + TRP |
| SFCT1 | BBER + BBX + TRZ̄ + TRZ̄I + TRP |
| SFCT2 | BBER + SKL + BBX + SKF |
| SFCT3 | SKU + SKF + TRP |
| LXSTM | LXM + STM |

FIG.—8

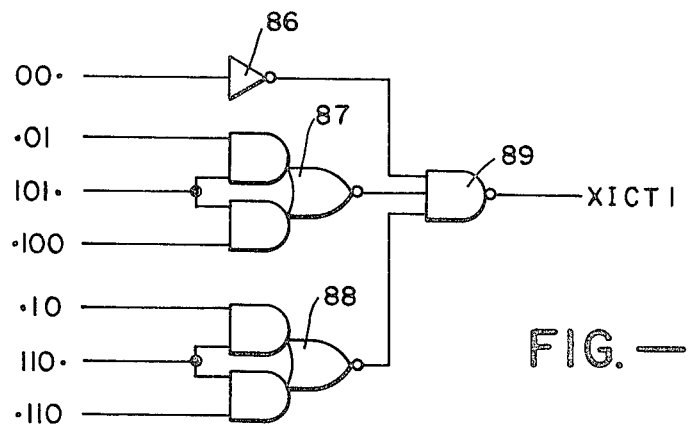
FIG.—9
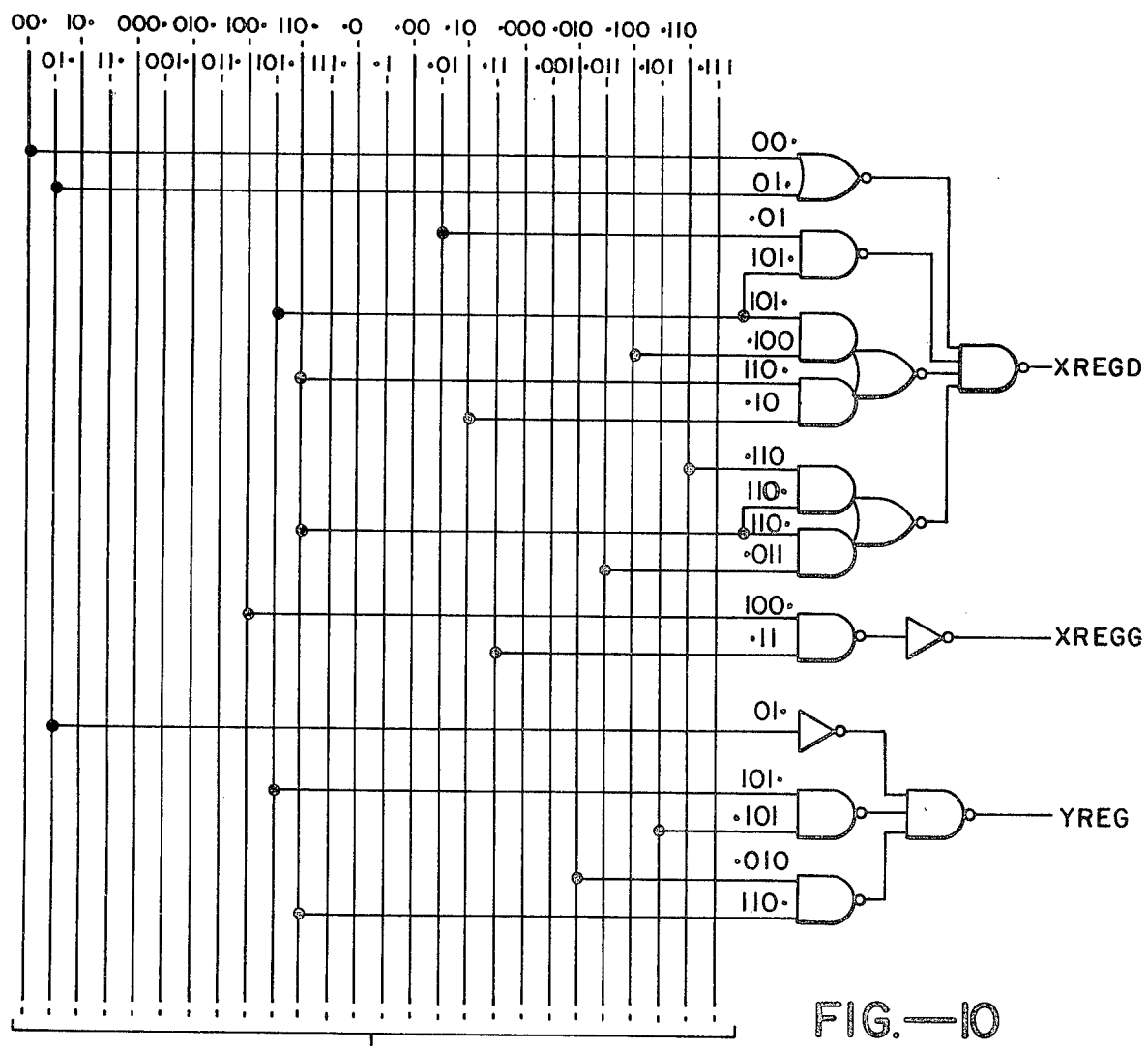
FIG.—10

DECODER AND METHOD UTILIZING PARTIAL AND REDUNDANT DECODING

CROSS REFERENCE TO RELATED APPLICATION

Cellular Integrated Circuit and Hierarchical Method, invented by Zasio, et al., Ser. No. 847,478, filed Nov. 1, 1977 and assigned to the same assignee as the present invention.

BACKGROUND OF THE INVENTION

This invention pertains generally to the decoding of multi-bit digital signals and more particularly to a decoder and method utilizing logic circuits to effect the desired decoding.

In medium scale integration (MSI) systems, programmable read-only memories (PROM's) are frequently used for decoding binary signals such as the operation codes (OPCODE) of a computer instruction set. In large scale integration (LSI) systems, however, PROM decoders are not satisfactory because they have unused bits which waste valuable chip space. In systems utilizing NMOS and PMOS technology, programmable logic arrays (PLA's) are sometimes used as decoders. Where they can be used, PLA's have the advantage of almost unlimited fan-in capability. However, PLA's are difficult to use with other technologies such as CMOS.

SUMMARY AND OBJECTS OF THE INVENTION

The invention provides a decoder and method utilizing logic circuits for decoding digital signals in applications such as LSI and CMOS where prior art decoding techniques are not practical or otherwise not desirable. According to the invention, the input signals are partially decoded by combining predetermined bits together to provide intermediate signals corresponding to decoded subsets of the input signals. Redundancy is provided by including some of the bits in more than one subset of the input signals. The intermediate signals are applied to a plurality of bus lines which extend past a plurality of logic blocks, and predetermined ones of the bus lines are connected to predetermined ones of the logic blocks. From the intermediate signals, the logic blocks synthesize output signals which represent a desired decoding of the input signals.

It is in general an object of the invention to provide a new and improved decoder and method.

Another object of the invention is to provide a decoder and method of the above character utilizing logic circuits and partial and redundant decoding.

Another object of the invention is to provide a decoder and method of the above character which are particularly suitable for decoding the operation codes of a computer instruction set.

Another object of the invention is to provide a decoder and method of the above character which can be utilized where prior art decoding techniques are not practical.

Additional object and features of the invention will be apparent from the following description in which the preferred embodiments are set forth in conjunction with the accompanying drawings.

BRIEF DESCRIPTION OF THE DRAWINGS

FIG. 1 is a plan view, largely schematic, of one embodiment of a decoder structure according to the invention.

FIGS. 2A-2C are tables of examples of subset groupings for partial and redundant decoding of multi-bit digital signals.

FIG. 3 is a block diagram of an input decoder for 6-bit input signals.

FIG. 4 is a logic diagram of a 2-bit decoder for use in the input decoder of FIG. 3.

FIG. 5 is a logic diagram of a 3-bit decoder for use in the input decoder of FIG. 3.

FIG. 6 is an enlarged fragmentary plan view, somewhat schematic, illustrating the output connections and the connections to the bus lines in the embodiment of FIG. 1.

FIG. 7 is a table showing an instruction set for a computer utilizing operation codes which can be decoded in accordance with the invention.

FIG. 8 is table of Boolean expressions for control signals derived from the operation codes of FIG. 7.7.

FIG. 9 is a logic diagram of a portion of a logic block for generating one of the control signals of FIG. 8.

FIG. 10 is a logic diagram of a representative one of the logic blocks in the embodiment of FIG. 1, which is arranged to provide certain of the control signals of FIG. 8.

FIG. 11 is a schematic plan view of a second embodiment of a decoder structure according to the invention.

DESCRIPTION OF THE PREFERRED EMBODIMENTS

As illustrated in FIG. 1, the decoder is constructed as a circuit within a region 15 on a semiconductor substrate, and the circuit and substrate are typically a portion of a large scale integrated (LSI) semiconductor chip. The decoder includes an input decoder 16 to which the multi-bit input signals are applied via input lines 17. In the embodiment illustrated the input decoder is formed in two sections 16a, 16b which are located toward opposite sides of the region 15. As discussed more fully hereinafter, the input decoder effects partial and redundant decoding of the input signals to provide a plurality of intermediate signals corresponding to decoded subsets of the input signals.

The intermediate signals from the input decoder are applied to bus lines 18 which carry these signals to logic gates arranged in blocks $B_1-B_n$ spaced along beside the bus lines. The logic gates in these blocks combine the intermediate signals to provide output signals on lines 19. The output signals represent a predetermined and desired decoding of the input signals.

As illustrated, bus lines 18 extend vertically past all of the logic blocks. Each of the logic blocks is formed in two sections which are located on opposite sides of the group of bus lines. Connections between the bus lines and the logic blocks are made by horizontally extending conductors 21. With all of the bus lines extending past all of the logic blocks, all of the intermediate signals are available throughout the device for connection to any of the logic blocks as needed. This arrangement also facilitates expansion and other changes in the device.

The number of input lines, bus lines and logic blocks in a particular decoder is, of course, dependent upon the application in which the device will be used and factors such as the number of bits in the input signals. By way of example, one presently preferred embodiment for decoding 6-bit input signals includes 6 input lines, 26 intermediate signals or bus lines, and 9 logic blocks.

As indicated above, the input decoder receives the input signals and generates the intermediate signals which are available to all of the logic blocks. In the input decoder, the input signals are partially decoded in that subsets consisting of one or more bits of the input signals are combined or decoded so that the intermediate signals correspond to the decoded subsets of the input signals. The decoding is redundant in that some of the input bits are included in more than one subset. For example, the first two bits of the input signal may be decoded into four intermediate signals at the same time the first three bits are also decoded into eight other intermediate signals. While this may result in more intermediate signals than would be required if the input signals were decoded in the conventional, straightforward manner, it permits the use of simpler and faster logic circuits to generate the desired set of output signals.

Examples of partial and redundant decoding of input signals having 5, 6 and 8 bits are shown in the tables of FIGS. 2A-2C. In the example of FIG. 2A, bits $a_1$, $a_2$ and $a_3$ are decoded as one subset to provide eight intermediate signals, bits $a_1$ and $a_2$ are decoded as a second subset to provide four additional intermediate signals, bit $a_1$ is decoded by itself as a third subset to provide two additional intermediate signals, bits $a_4$ and $a_5$ are decoded as another subset to provide four more intermediate signals, and bit $a_4$ is decoded by itself to provide two additional intermediate signals. In this particular example bit $a_1$ is included in three subsets, bit $a_2$ is included in two subsets, and bit $a_4$ is included in two subsets. This example results in 20 intermediate signals and requires 20 bus lines to carry these signals to the logic blocks where the output signals are synthesized. The example of FIG. 2B utilizes five subsets ranging in size from 1 to 3 bits and provides 26 intermediate signals. The example of FIG. 2C uses eight subsets and results in 34 intermediate signals. It is to be understood that the particular subset combinations shown in FIG. 2 are merely exemplary and that a wide variety of such combinations is possible. In practice, the subsets and redundant bits are chosen by looking at the desired bit patterns and selecting the ones which occur most frequently.

FIG. 3 illustrates an input decoder which utilizes the techniques of FIG. 2B to provide partial and redundant input decoding of a 6-bit input signal. This decoder includes a 2-bit decoder 26 which receives input bits $a_1$ and $a_2$, a 3-bit decoder 27 which receives bits $a_1$, $a_2$ and $a_3$, inverters 28 and 29 which decode bit $a_4$, a 2-bit decoder 31 which receives bits $a_4$ and $a_5$, and a 3-bit decoder 32 which receives bits $a_4$, $a_5$ and $a_6$.

A 2-bit decoder suitable for use as either decoder 26 or decoder 31 of FIG. 3 is illustrated in FIG. 4. This decoder includes input inverters 36-39, 2-input NAND gates 41-44, and output inverters 46-49. The NAND gates receive signals corresponding to the various combinations of the input bits and their inverses and produce the output or intermediate signals $\overline{b_0}\,\overline{b_1}$, $\overline{b_0}\,b_1$, $b_0\,\overline{b_1}$ and $b_0\,b_1$ on lines 51-54 connected to the outputs of inverters 46-49. Thus, each 2-bit decoder provides four output or intermediate signals corresponding to the decoded subset applied thereto.

FIG. 5 illustrates a 3-bit decoder which is suitable for use as either decoder 27 or decoder 32 in the input decoder of FIG. 3. The 3-bit decoder includes input inverters 56-61, 3-input NAND gates 63-70, and output inverters 72-79. The NAND gates receive signals corresponding to the various combinations of the input bits and their inverses and produce corresponding intermediate or output signals at the outputs of inverters 72-79. Thus, each 3-bit decoder provides eight intermediate or output signals which correspond to the decoded subsets applied thereto.

Referring now to FIG. 6, bus lines 18 are formed as a first metallization layer on substrate 15. In this embodiment, horizontal conductors 21, which interconnect the bus lines and logic blocks, are poly-silicon wires which are separated from the bus lines or first metallization layer by an insulating layer (not shown). The poly-silicon wires are connected to the desired bus lines by contacts 81 which extend through the insulating layer.

Even though the logic blocks are formed in sections which are located on opposite sides of bus lines 18, it may be desirable to have all of the decoded output signals available on one side of the device, e.g. the right side. In this case, the output lines 19 for the logic block sections on the left side of the substrate are formed as a second metallization layer which is insulated from the first metallization layer. Of course, any combination of two or more conductor layers (such as metallization or polysilicon) may be employed. These output lines extend horizontally across the bus lines and through space provided between the logic block sections on the right side of the substrate.

The circuitry employed in logic block $B_1$-$B_n$ is determined by the particular decoding functions to be performed and the partially decoded intermediate signals which are available. One use for which the decoder is particularly suitable is decoding the operation codes of a computer instruction set to provide control signals for the computer. The instruction set is determined by the architecture of the computer system, and a representative instruction set and opcode pattern are illustrated in FIG. 7, and the Boolean expressions for control signals derived from this instruction set are provided in FIG. 8. As an example of the manner in which the control signals are generated, the control signal XICT1 is considered. From FIG. 8,

XICT1=BBER+MVR+MDRX+TRZ+T-
RZI+TRP where the symbol "+" denotes the logical OR function. Each operation code on the right hand side of this expression is synthesized from appropriate ones of the partially decoded intermediate signals. Thus, referring to FIG. 7, it is seen that the following relationships exists:
BBER=00
MVR=10101=101.01
MDRX=101100=101.100
TRZ=110100=110.100
TRZI=110101=110.101
TRP=110110=110.110
where the 2 and 3-bit numbers (e.g. 00, 101, 01) which are ANDed together to form the operation codes are the intermediate signals from the input decoder.

A logic circuit for generating the control signal XICT1 from the intermediate signals is shown in FIG. 9. This circuit includes an inverter 86, AND-OR-INVERT gates 87, 88 and a 3-input NAND gate 89. In this figure and in FIG. 10, the significance of the bits in the intermediate signals is indicated by a dot placed before or after each signal. Thus, for example, in FIG. 9 the dot after the intermediate signal 00 indicates that this signal is from the left or most significant bits, and the dot before the signal 01 indicates that this signal is from the right or least significant bits. Since TRZ=110.100 and TRZI=110.101, TRZ+TRZI=110.10. Referring now to FIG. 9, inverter 86 provides a signal corresponding to operation code BBER, AND-OR-INVERT gate 87 provides an output corresponding to MVR+MDRX, and AND-OR-INVERT gate 88 provides a signal corresponding to TRZ+TRZI+TRP. These signals are combined in NAND gate 89 to provide the control signal XICT1.

When the decoder is used in place of PROM's, each of the logic blocks can be arranged to perform the functions of one of the PROMs. FIG. 10 illustrates the circuitry of a complete logic block which generates the control signals XREGD, XREGG and YREG. As in the embodiment of FIG. 9, the appropriate intermediate signals are obtained from bus lines 18 and combined in suitable logic gates to provide the desired output or control signals.

One of the advantages of the decoder structure is that it can be modified or enlarged relatively easily. The device can be expanded simply by extending the bus lines and adding one or more additional blocks along the extended lines. For modifications, the circuitry in one or more of the blocks can be changed and the connections to the bus lines can be changed without disturbing the remaining blocks. In the event that the size of one or more blocks is changed so that it is necessary to relocate the remaining blocks, they can simply be repositioned vertically along the bus lines as desired.

Another advantage is that the interconnecting wires for each logic clock have simple and short patterns due to the simple, localized logic involved. As can be seen from FIG. 10, no cross-overs of the connecting leads for the logic blocks are required, and consequently all of the connection can be made in one layer. The application cross-referenced above is hereby incorporated by reference for the purpose of teaching the layout rules and the process steps for one suitable LSI technology which includes and the AND-OR-INVERT gates of FIGS. 9 and 10.

FIG. 11 illustrates an embodiment of the encoder in which bus lines 18 are folded to provided a structure which is more nearly square than the embodiment of FIG. 1. In the embodiment of FIG. 11, the bus lines include a central vertical section 18a, a lower horizontal section 18b, and vertical side sections 18c, 18d. Logic blocks $B_1-B_8$ are positioned along the different sections of the bus lines, with all of the bus lines still being available to all of the blocks. The blocks which are located between the central and the side sections of the bus lines have vertical output lines 91 which carry the output signals from these blocks to their destinations on the same LSI chip.

Operation and use of the decoder and therein the method of the invention can be summarized as follows. The signals on input lines 17 are partially decoded by input decoder 16 to provide a plurality of intermediate signals from which the desired output signals can be synthesized. The input decoding is redundant in that some of the input bits are included in more than one of the subsets which are decoded to provide the intermediate signals. The intermediate signals are delivered to bus lines 18, and appropriate ones of the intermediate signals are combined in logic blocks $B_1-B_n$ to provide the desired output signals.

While a number of embodiments have been described, the method of partial and redundant decoding of the present invention varies depending on the particular application. For example, intermediate redundant signals in accordance with the present invention may include OR terms, such as a, $\overline{a_2}$, $a_3+\overline{a_1}$ $a_2$ $\overline{a_3}$, if such signals are useful in many places.

While the particular embodiments described have a regular structure, the actual layouts of the decoders in accordance with the present invention do not necessarily follow a regular structure. For example, when automatic layout and wiring methods are employed, the spatial location tends to be more irregular.

It is apparent from the foregoing that a new and improved decoder and method have been provided. While only certain presently preferred embodiments have been described, as will be apparent to those familiar with the art, certain changes and modifications can be made without departing from the scope of the invention as defined by the following claims.

What is claimed is:

1. In a method for decoding a digital input signal having a plurality of bits, the steps of: partially decoding the input signal by combining predetermined ones of the bits together to provide intermediate signals corresponding to decoded subsets of the input signal, at least one of the predetermined bits of the input signal being included in more than one of the subsets of said signal, applying the intermediate signals to a plurality of bus lines which extend past a plurality of logic blocks, and combining in the logic blocks predetermined ones of the intermediate signals from the bus lines to provide output signals as a predetermined decoding of the input signal.

2. In a decoder for a binary input signal having a plurality of bits: input decoder means for partially decoding the input signal by combining predetermined ones of the bits together to provide intermediate signals corresponding to decoded subsets of the input signal said input decoder means having means for including at least one of said bits redundantly in more than one of said subsets, a plurality of logic blocks, a plurality of bus lines connected to the input decoder means for receiving the intermediate signals, said bus lines extending past the logic blocks, and means connecting predetermined ones of the bus lines to predetermined ones of the logic blocks whereby the logic blocks combine the intermediate signals from the predetermined lines to provide output signals representative of a predetermined decoding of the input signal.

3. In a decoder for a digital input signal having a plurality of bits: a substrate, input decoder means on the substrate for partially decoding the input signal by combining predetermined ones of the bits together to provide a plurality of intermediate signals corresponding to decoded subsets of the input signal said input decoder means having means for including at least one of said bits in more than one of said intermediate signals whereby said at least one of said bits is included in more than one of said decoded subsets, a plurality of generally parallel bus lines extending along the substrate and connected to the input decoder means for receiving the intermediate signals, one of the intermediate signals being applied to each of the bus lines, a plurality of logic circuit blocks mounted on the substrate and spaced along beside the bus lines, all of the bus lines extending past all of the logic blocks, and a plurality of conductors on the substrate interconnecting predetermined ones of the bus lines with predetermined ones of the logic blocks whereby the logic blocks combine the intermediate signals from the predetermined lines to provide output signals corresponding to a predetermined decoding of the input signal.

4. The decoder of claim 3 wherein the bus lines extend centrally of the substrate and the logic blocks include sections disposed along both sides of the bus lines.

5. The decoder of claim 4 including additional conductors extending across the bus lines and connected to the logic blocks on one side of said lines for carrying output signals from the logic blocks on the one side to the other side of the substrate.

6. The decoder of claim 4 wherein the conductors interconnecting the bus lines and logic blocks are arranged in a single plane with none of the conductors crossing over any of the others of said conductors.

7. A digital decoder having digital input signals defining a plurality of digital bits comprising, a substrate, input decoder means on the substrate for partially and redundantly decoding the input signals by combining predetermined ones of the input signals to provide a plurality of intermediate signals corresponding to decoded subsets of the input signals, a plurality of bus lines connected to the input decoder means for receiving the intermediate signals, one of the intermediate signals being applied to each of the bus lines, a plurality of logic circuit blocks mounted on the substrate and spaced from the bus lines, and a plurality of conductors on the substrate interconnecting predetermined ones of the bus lines with predetermined ones of the logic blocks whereby the logic blocks combine the intermediate signals from the predetermined lines to provide output signals corresponding to a predetermined decoding of the input signals.

8. A decoder for decoding a digital input signal having a plurality of bits comprising, a plurality of input decoder means each for partially decoding the input signal by logically combining a predetermined subset of said bits to provide intermediate signals corresponding to a partial decoding of said subset, first and second ones of said input decoder means having respectively first and second logic means for logically combining at least one of said bits redundantly in first and second ones of said subsets, respectively, to provide first and second ones of said intermediate signals, respectively, corresponding to a partial and redundant decoding of said first and second subsets, respectively, and a plurality of logic block means, each connected to selected ones of said input decoder means for receiving selected ones of the intermediate signals, said plurality of logic block means including first and second logic blocks each connected to receive one or more intermediate signals from said first or from said second input decoder means, and each of said first and second logic blocks for logically combining selected ones of the connected intermediate signals to provide respectively, first and second output signals each representative of a predetermined non-redundant decoding of the input signal.

9. The decoder of claim 8 including a semiconductor substrate, said input decoder means and said logic block means arrayed on said substrate, including a plurality of parallel bus lines on said substrate and connected to said input decoder means for conducting said intermediate signals, and including a plurality of conductors on said substrate interconnecting predetermined ones of said bus lines with predetermined ones of the logic block means.

10. The decoder of claim 9 wherein the bus lines extend centrally of the substrate and the logic block means include sections disposed along both sides of the bus lines.

11. The decoder of claim 9 including additional conductors extending across the bus lines and connected to the logic blocks on one side of said lines for carrying output signals from the logic blocks on the one side to the other side of the substrate.

12. The decoder of claim 9 wherein the conductors interconnecting the bus lines and logic blocks are arranged in a single plane with none of the conductors crossing over any of the others of said conductors.

* * * * *